United States Patent
Parkhurst

(10) Patent No.: US 9,000,844 B2
(45) Date of Patent: Apr. 7, 2015

(54) POWER EFFICIENT TRANSCONDUCTANCE AMPLIFIER APPARATUS AND SYSTEMS

(75) Inventor: Charles Parkhurst, Murphy, TX (US)

(73) Assignee: Texas Instruments Incorporated, Dallas, TX (US)

(*) Notice: Subject to any disclaimer, the term of this patent is extended or adjusted under 35 U.S.C. 154(b) by 553 days.

(21) Appl. No.: 13/357,203

(22) Filed: Jan. 24, 2012

(65) Prior Publication Data
US 2013/0187620 A1    Jul. 25, 2013

(51) Int. Cl.
*H03F 3/45* (2006.01)

(52) U.S. Cl.
CPC ........................................ *H03F 3/45* (2013.01)

(58) Field of Classification Search
CPC ................................ H03F 3/45183; H03F 3/45
USPC .................................................. 330/252–261
See application file for complete search history.

(56) References Cited

U.S. PATENT DOCUMENTS

| | | |
|---|---|---|
| 5,101,126 A | 3/1992 | Butler et al. |
| 5,510,754 A | 4/1996 | Moraveji et al. |
| 5,936,466 A | 8/1999 | Andoh et al. |
| 6,204,654 B1 | 3/2001 | Miranda et al. |
| 6,727,748 B2 | 4/2004 | Kuo |
| 7,078,962 B2 * | 7/2006 | Parkhurst ..................... 327/563 |
| 2010/0001797 A1 * | 1/2010 | Ishiguro et al. ............... 330/253 |

OTHER PUBLICATIONS

This Application is related to U.S. Appl. Nos. 13/311,242 and 13/279,042, filed Dec. 5, 2011.

* cited by examiner

*Primary Examiner* — Robert Pascal
*Assistant Examiner* — Khiem Nguyen
(74) *Attorney, Agent, or Firm* — Alan A. R. Cooper; Frank D. Cimino

(57) ABSTRACT

Embodiments and methods herein operate as two-stage voltage controlled current sources (i.e., dynamic current sources) operating in class AB mode. Phase-delayed current injection circuits are associated with first-stage bias, second-stage bias, or both. The current injection circuits operate to quickly re-charge inter-stage parasitic capacitance associated with the active side of the class AB dynamic current source shortly after that side becomes inactive. Doing so quickly dissipates an otherwise slowly-decaying residual drive signal to prevent the output stage from continuing to conduct after the associated side of the current source becomes inactive. Excessive current consumption and possible destructive operation of the output stage are mitigated as a result.

18 Claims, 6 Drawing Sheets

US 9,000,844 B2

POWER EFFICIENT TRANSCONDUCTANCE AMPLIFIER APPARATUS AND SYSTEMS

TECHNICAL FIELD

Embodiments described herein relate to apparatus and methods associated with electronic circuits, including structures and methods associated with dynamic current sources.

BACKGROUND INFORMATION

Linear amplifiers are used in a variety of applications, including, e.g., audio, video, and power supplies. Linearity between an amplifier input signal and the corresponding output signal enables faithful reproduction of analog information presented at the amplifier input. A key metric associated with linearity and amplifier quality is slew rate, often expressed as volts per second (millivolts per microsecond, etc.). Slew rate is a measure of the maximum rate of change of the information signal at a particular point within the amplifier. A poor slew rate may result in a distorted output, as fast-changing portions of the information signal are delayed in time relative to other portions of the signal.

One application for which amplifier slew rate may be particularly important is that of regulating the output voltage of a switching DC-DC voltage converter. A switching DC down-converter (known in the art as a "buck" converter) alternately makes and breaks a circuit path between the converter DC supply input and an energy conversion inductor. During the ON state, the inductor stores energy in a magnetic field as current flows through the inductor. During the OFF state, the collapsing magnetic field generates current at the converter output. The inductor thus integrates the switched waveform to create an output voltage waveform proportional to the duty cycle of the active-state switched waveform. A filter capacitor is typically used to smooth the voltage waveform at the converter output.

To maintain a voltage set-point at the output of a DC-DC converter as load current demand changes, the output voltage level may be monitored and fed back to a circuit controlling the switching duty cycle. The slew rate of the DC-DC converter feedback circuit may be particularly important in applications requiring tight voltage regulation. For example, modern processors typically employ hundreds of millions of transistors. The on/off state of each transistor contributes to the overall instantaneous current load presented to the DC power supply. The instantaneous current load may be quite high and may change substantially within a few microseconds. And, low-voltage operation associated with today's microprocessor technology presents an additional challenge to DC power supply regulation requirements, given that small supply voltage variations may represent a significant percentage of a processor's operating voltage margin.

The slew rate of components associated with the output voltage controlling feedback loop in a DC-DC converter may limit the regulation precision of the converter. Signals applied to the differential inputs of the error amplifier typically include a reference voltage and a voltage divided sample of the converter output. The feedback error signal appears at the output of the error amplifier. Some error amplifiers use a "dynamic bias" current circuit and provide the error signal in the form of a variable current source. The magnitude of the output current source is proportional to the magnitude of the difference between the reference voltage and the converter output sample voltages appearing at the error amplifier differential inputs.

SUMMARY OF THE INVENTION

Embodiments and methods herein operate as two-stage voltage controlled current sources (i.e., dynamic current sources) operating in class AB mode. A differential input signal is applied across the inputs of a first-stage pair of transconductance devices. A second-order replica of the input signal is produced at the output of one of the first-stage transconductance devices if the differential input signal is positive and at the output of the other first-stage transconductance device if the differential input signal is negative. The second order signal is presented at the input of a corresponding second stage transconductance device. The second order input signal is proportionally replicated at the output of the second-stage transconductance device as a current source. Embodiments herein utilize phase-delayed current injection circuits to quickly re-charge inter-stage parasitic capacitance associated with the active side of the class AB dynamic current source shortly after that side becomes inactive. Doing so quickly dissipates an otherwise slowly-decaying residual drive signal. Without the current injection, the residual drive signal may cause the output stage to continue to conduct after the associated side of the current source becomes inactive. Such behavior increases current consumption and may cause destructive operation of the output stage, particularly during operation at higher frequencies.

As used herein, the term "transconductance device" means a device used in an electronic circuit to control electrical current as a function of a voltage input to the device. As such, transconductance devices may include semiconductor devices such as metal oxide semiconductor field effect transistors (MOSFETs) with gate, source, and drain terminals, and bipolar junction transistors with base, collector, and emitter terminals. Transconductance devices may also be embodied in vacuum tube devices, organic transistors, and other technologies. The term "current channel" used herein in conjunction with a transconductance device means a path through the device along which current controlled by the device flows (e.g., the path between source and drain for a MOSFET, the path between collector and emitter for a bipolar junction transistor, etc.). The term "channel-coupled," means that a current channel associated with a transconductance device is coupled to another device. The term "input element" means a MOSFET gate, a bipolar junction transistor base, a vacuum tube grid, etc.

DETAILED DESCRIPTION

Figure 1:
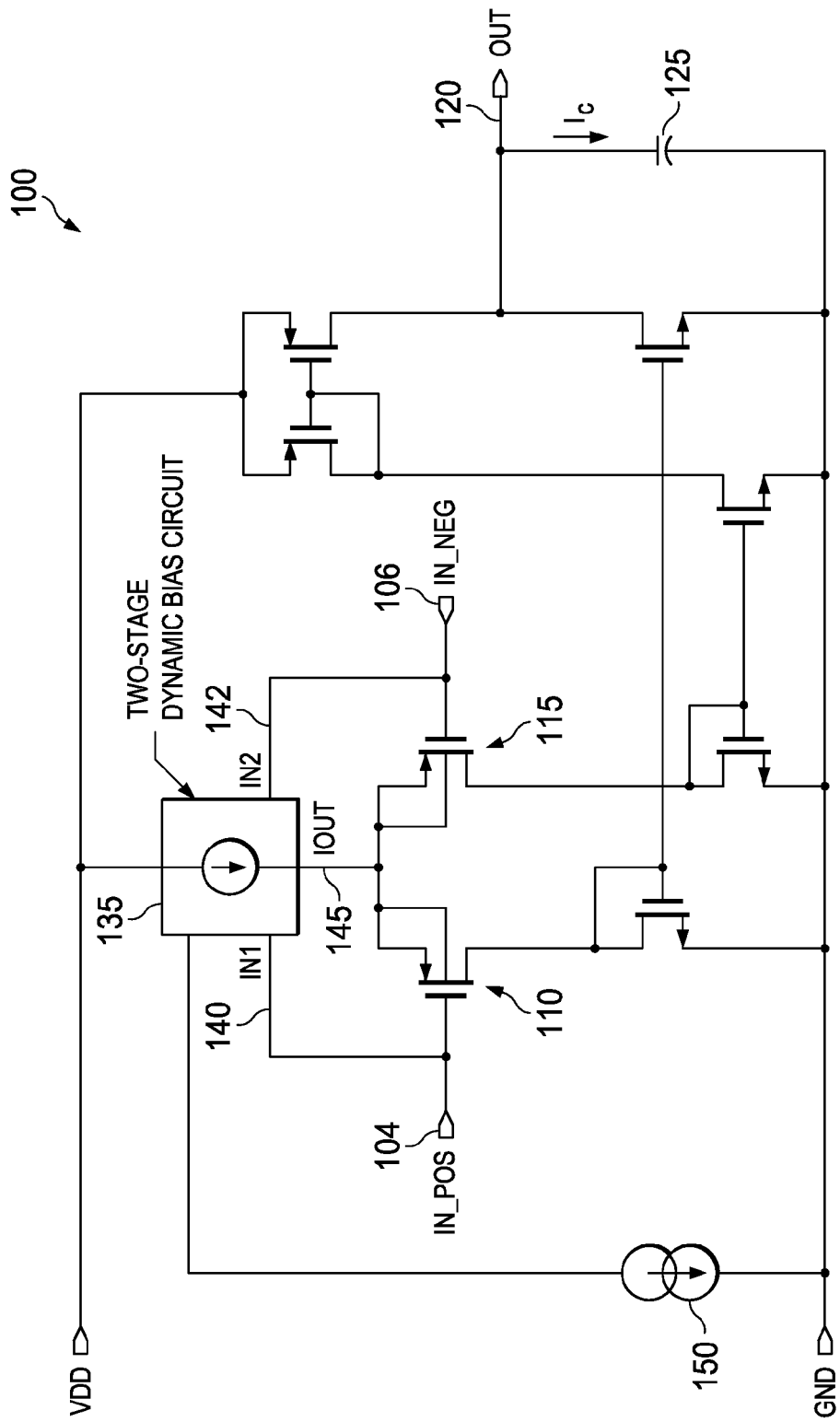
FIG. 1 illustrates an example application of a two-stage voltage-controlled current source as a dynamic bias source for a differential input linear amplifier according to various example embodiments of the invention.

FIG. 1 illustrates an example application of a two-stage voltage-controlled current source 135 as a source of dynamic bias for a differential input linear amplifier 100 according to various example embodiments of the invention. The term "linear amplifier" in the context of these disclosures includes operational amplifiers ("op-amps") such as op-amps used as components of feedback mechanisms in various circuits.

A differential signal may be applied across positive and negative inputs 104 and 106 corresponding to MOSFETs 110 and 115, respectively. A linearly-amplified replica of the input signal appears at a single-ended output 120 of the linear amplifier 100. Without more, however, slew rate at the output 120 could suffer due to loading effects associated with the compensation capacitor 125. More to the point, the output circuit requires a current source to charge the compensation capacitor 125; and the amplifier slew rate is a function of how quickly the compensation capacitor 125 can be charged. The dynamic current source 135 provides current as needed to charge the compensation capacitor 125, as follows. The differential input signal is received at the dynamic current source 135 at differential inputs 140 and 142. The output current 145 is transferred through the amplifier by a series of current mirrors and is directed to charge or discharge the compensation capacitor 125 according to the polarity of the differential input signal. Current source 150 is a root current source distributed to various nodes within the dynamic current source 135 as further described below.

Figure 2:
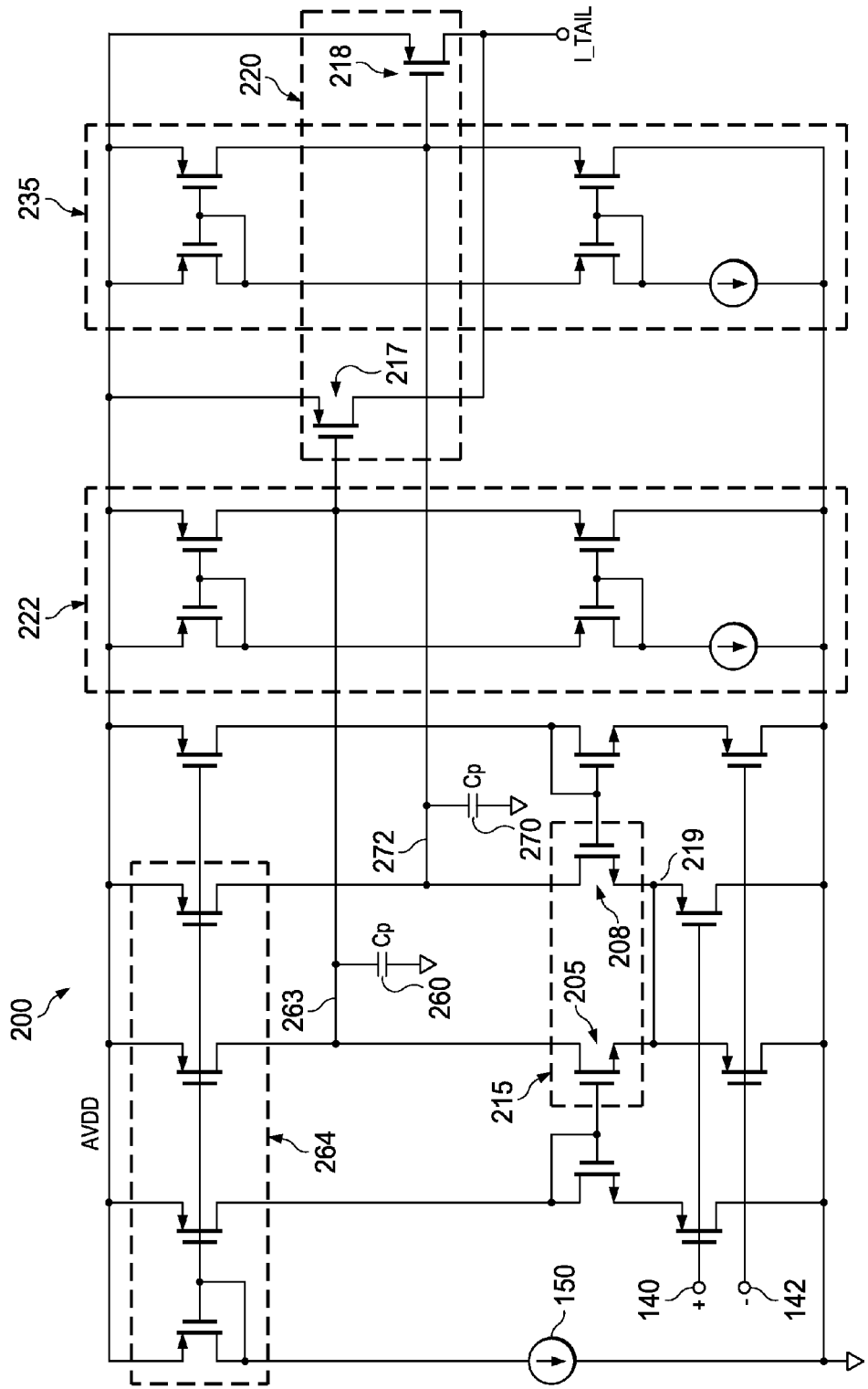
FIG. 2 is schematic diagram of a two-stage dynamic current source according to various example embodiments.

FIG. 2 is schematic diagram of a two-stage dynamic current source 200 according to various example embodiments. The dynamic current source 200 includes a first amplification stage 215 comprising transconductance devices 205 and 208 arranged as a long-tailed pair. A second amplification stage 220 including transconductance devices 217 and 218 arranged as a long-tailed pair is communicatively coupled to the first amplification stage 215. As used herein, the term "long-tailed pair" means a pair of transconductance devices arranged with a common current channel node and operating in class AB mode.

A differential input voltage is presented to the current source 200 at differential input terminals 140 and 142. The input voltage causes transconductance devices 205 and 217 to conduct if the input voltage is positive with respect to common node 219. The amplification path through transconductance devices 205 and 217 is referred to herein as the "positive side" of the current source 200. The input voltage causes transconductance devices 208 and 218 to conduct if the input voltage is negative with respect to the node that is common to transconductance devices 205 and 208. The amplification path through transconductance devices 208 and 218 is referred to herein as the "negative side" of the current source 200. Second stage transconductance devices 217 and 218 thus source current from the dynamic current source 200 in proportion to the differential input signal.

Various biasing arrangements are contemplated in these disclosures. In some embodiments, for example, the dynamic current source 200 includes a master current mirror 264 communicatively coupled to the differential input transconductance devices 205 and 208. The master current mirror 264 is coupled to root current source 150 and provides bias current to the first stage differential input transconductance devices 205 and 208. Circuits 222 and 235 provide bias to the second stage 220.

In some embodiments, biasing configurations and other factors may cause inter-stage parasitic capacitances 260 and 270 to be present at inter-stage nodes 263 and 272, respectively. The inter-stage parasitic capacitances may create an undesirable operational frequency dependency. The inter-stage capacitance may hold the drive signals appearing at the second stage amplifier inputs 263 and 272, respectively, and thus increase their decay periods. At some frequencies, drive signals may persist until the next cycle, causing current to flow continuously through both sides of the output stage. Such behavior causes the dynamic current source 200 to tend toward class A operation instead of operating as a class AB apparatus as designed. Excessive output currents may result.

Figure 3:
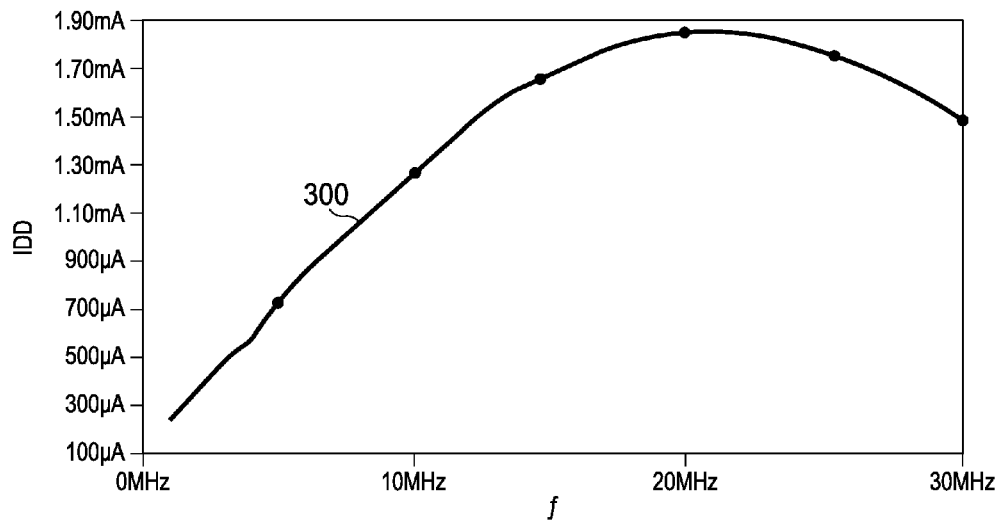
FIG. 3 is a plot showing a frequency dependency associated with current sourced by the dynamic current source of FIG. 2.

FIG. 3 is a plot 300 showing a frequency dependency associated with current sourced by the dynamic current source 200 of FIG. 2. The magnitude of the differential input voltage swing is kept constant while the differential input frequency is varied. Plot 300 shows output current rising steeply as a function of frequency. Excessive current results as residual drive signals held by the parasitic capacitances 260 and 270 cause both output transconductance devices 217 and 218 to continue to be driven in both halves of the cycle.

Embodiments herein utilize phase-delayed current injection circuits to quickly re-charge the parasitic capacitance associated with the active side of the class AB dynamic current source shortly after that side becomes inactive. Doing so enables the associated drive signal at the inactive output stage to quickly decay.

Figure 4:
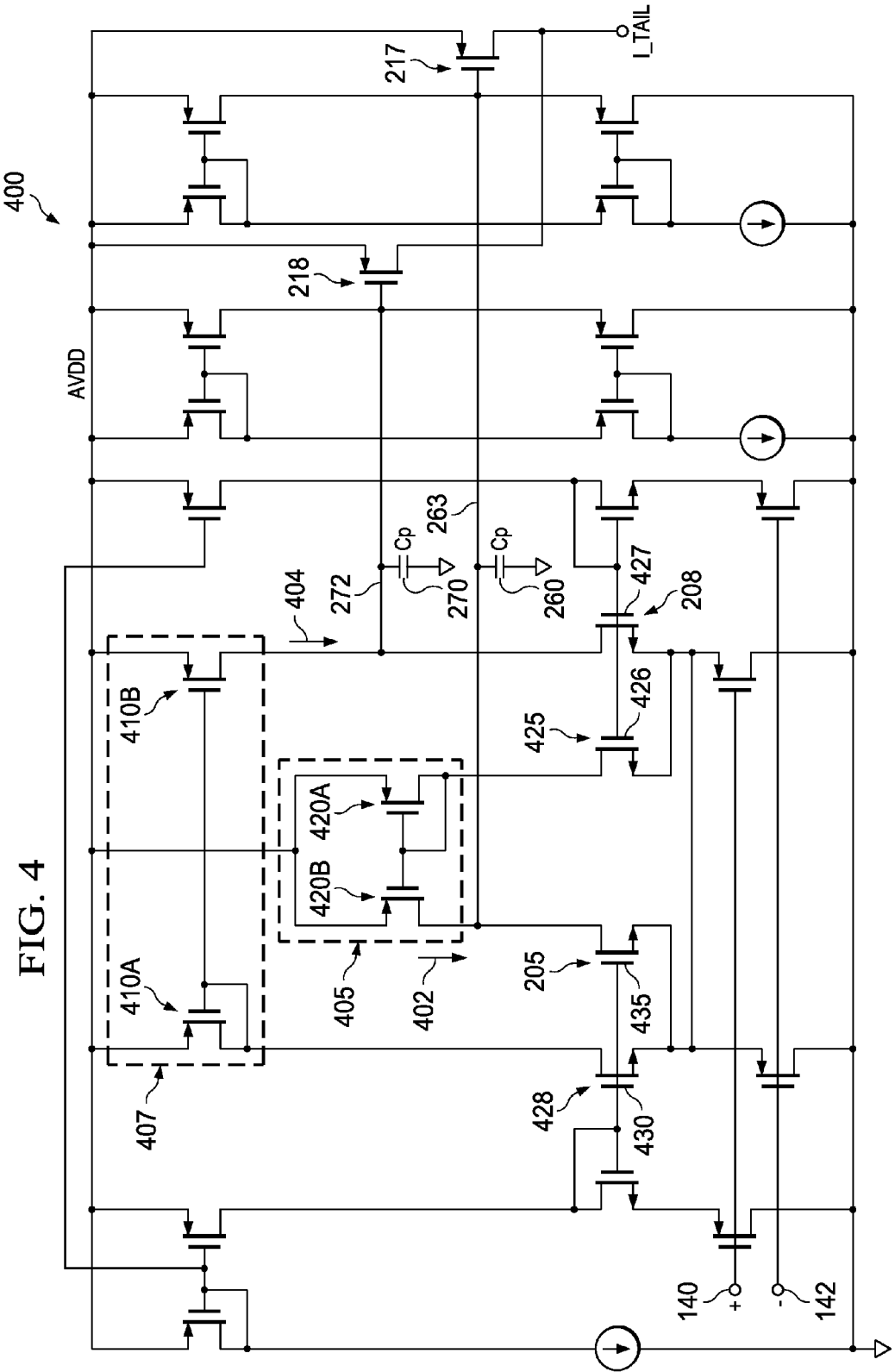
FIG. 4 is a schematic diagram of a two-stage dynamic current source including a circuit to mitigate frequency dependency associated with inter-stage parasitic capacitance according to various example embodiments.

FIG. 4 is a schematic diagram of a two-stage dynamic current source 400 including a circuit to mitigate frequency dependency associated with inter-stage parasitic capacitance according to various example embodiments.

The current source 400 includes positive side and negative side differential input transconductance devices 205 and 208 arranged as a long-tailed pair. The current source 400 accepts a differential input signal at terminals 140 and 142, as previously described in conjunction with FIG. 2.

The dynamic current source 400 includes a positive side phase-dependent current source 402 communicatively coupled to the output 263 of the positive side differential input transconductance device 205. The current source 400 also includes a negative side phase-dependent current source 404 communicatively coupled to the output 272 of the negative side differential input transconductance device 208. The positive and negative side phase-dependent current sources 402 and 404, respectively, provide current for positive and negative side output signal recovery during a phase period when the differential input signal no longer activates the respective side of the dynamic current source 400.

In some embodiments, the positive side and negative side phase-dependent current sources may be configured as current mirrors (e.g., the current mirrors 405 and 407). The positive side recovery current mirror 405 includes mirror input transconductance device 420A and mirror output transconductance device 420B. Likewise, the negative side recovery current mirror 407 includes mirror input transconductance device 410A and mirror output transconductance device 410B. In this example embodiment, a positive side recovery transconductance device 425 is communicatively coupled to the input transconductance device 420A associated with the positive side current mirror 405. Specifically, the current channel of positive side current mirror input transconductance device 420A is coupled in series with the current channel of the positive side recovery transconductance device 425. An input element 426 of the positive side recovery transconductance device 425 is coupled to an input element 427 of the negative side differential input transconductance device 208.

The current channel associated with the positive side current mirror output transconductance device 420B is coupled to the output of the positive side differential input transconductance device 205. When the negative side of the dynamic current source 400 is active, the negative side differential input transconductance device 208 conducts. Positive side recovery transconductance device 425 also conducts at this time, as the latter is commonly gated to differential input transconductance device 208. The resulting current is transferred through the positive side current mirror 405 and injects current to the positive side output node 263. The injected current charges parasitic capacitance 260 in order to expedite the decay of any residual drive signal at the inter-stage node 263.

A symmetrical structure and sequence apply to recovery of the negative side inter-stage node 272, as follows. A negative side recovery transconductance device 428 is communicatively coupled to the input transconductance device 410A associated with the negative side current mirror 407. Specifically, the current channel of negative side current mirror input transconductance device 410A is coupled in series with the current channel of the negative side recovery transconductance device 428. An input element 430 of negative side recovery transconductance device 428 is coupled to an input element 435 of the positive side differential input transconductance device 205.

The current channel associated with the negative side current mirror output transconductance device 410B is coupled to the output of the negative side differential input transconductance device 208. When the positive side of the dynamic current source 400 is active, the positive side differential input transconductance device 205 conducts. Negative side recovery transconductance device 428 also conducts at this time, as the latter is commonly gated to differential input transconductance device 205. The resulting current is transferred through the negative side current mirror 407 and injects current to the negative side output node 272. The injected current charges parasitic capacitance 270 in order to expedite the decay of any residual drive signal at the inter-stage node 272.

Figure 5:
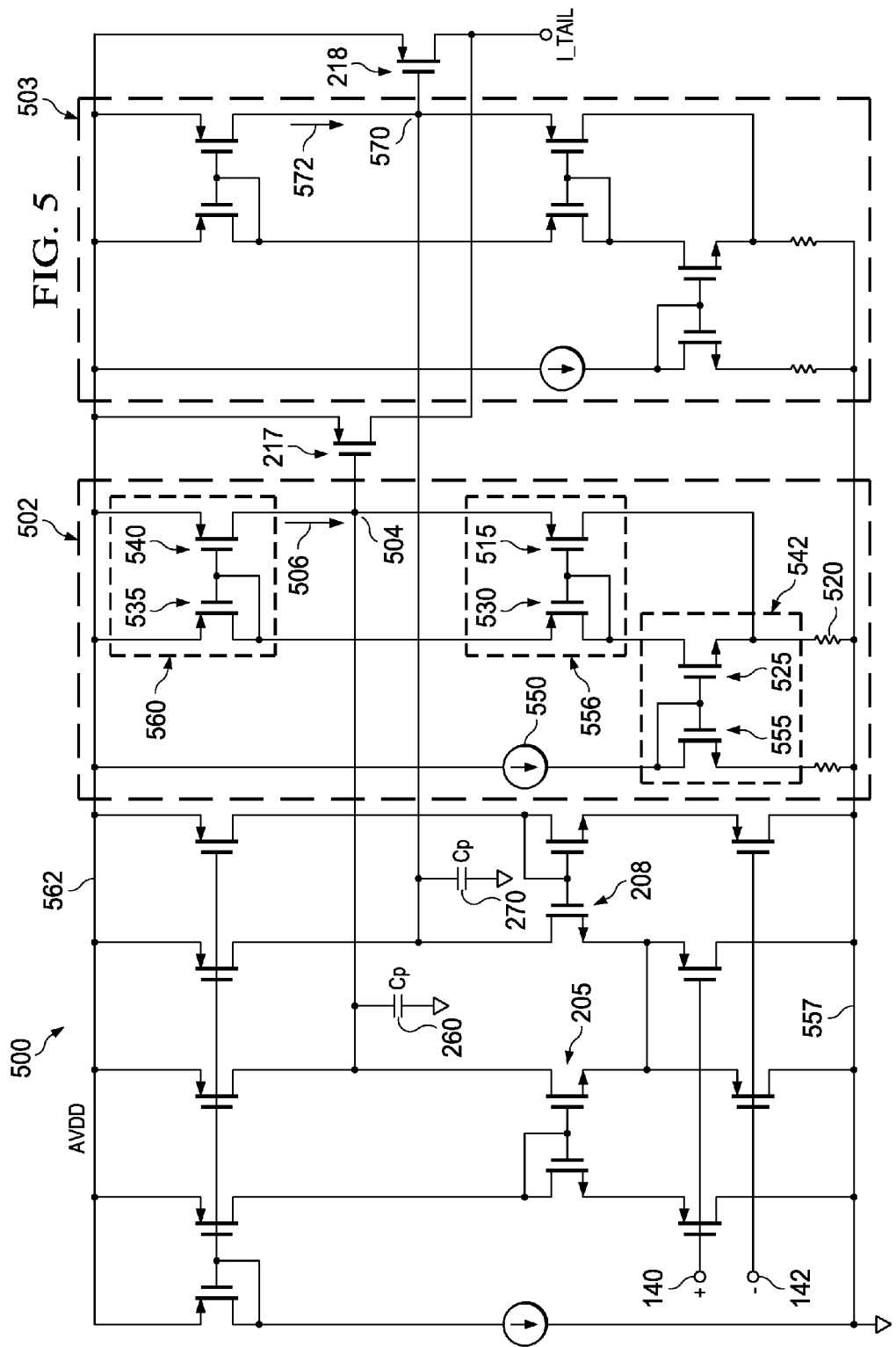
FIG. 5 is a schematic diagram of a two-stage dynamic current source including a circuit to mitigate frequency dependency associated with inter-stage parasitic capacitance according to various example embodiments.

FIG. 5 is a schematic diagram of a two-stage dynamic current source 500, including a circuit to mitigate frequency dependency associated with inter-stage parasitic capacitances 260 and 270 according to various example embodiments. The structure and methods described with respect to FIG. 4 modify first stage biasing elements as shown in FIG. 2. In contrast, structures and methods described with respect to FIG. 5 modify second stage biasing arrangements as shown in FIG. 2.

The dynamic current source 500 includes a first amplification stage comprising a pair of differential input transconductance devices 205 and 208. The input transconductance devices 205 and 208 are arranged as a long-tailed pair to accept a differential input signal at input terminals 140 and 142.

The current source 500 also includes a second amplification stage comprising positive side and negative side output transconductance devices 217 and 218 arranged as a long-tailed pair. The output transconductance devices 217 and 218 are communicatively coupled to the first stage transconductance devices 205 and 208, respectively, to source current in an amount proportional to the differential input signal presented at inputs 140 and 142. The positive side of the current source 500 includes first stage transconductance device 205, second stage transconductance device 217, and associated positive side components. The negative side of the current source 500 includes first stage transconductance device 208, second stage transconductance device 218, and associated negative side components.

The current source 500 also includes a positive side bias circuit 502 coupled to the second stage transconductance device 217 and a negative side bias circuit 503 coupled to the second stage transconductance device 218. The positive and negative sides of the differential input, class AB current source 500 are symmetrical, as illustrated in FIG. 5. The detailed description of the positive side bias circuit 502 below is equally applicable to the negative side bias circuit 503.

The positive side bias circuit 502 is coupled to an input node 504 associated with the positive side output transconductance device 217. The bias circuit 502 is configured to phase-delay a drive signal appearing at the input node 504. The bias circuit 502 injects a recovery current 506 proportional to the phase-delayed positive side drive signal into the input node 504. The recovery current forces any residual signal held by parasitic capacitance 260 at the input node 504 to a quiescent state when the differential input signal no longer activates a positive side of the dynamic current source 500.

The bias circuit 502 includes a first bias transconductance device 515. A current channel associated with the first bias transconductance device 515 is coupled between the input node 504 and a negative feedback resistor 520 to ground. A negative drive signal at the input node 504 causes the output transconductance device 217 to conduct. The negative drive signal also decreases bias voltage across the current channel associated with the first bias transconductance device 515. Consequently, current through the first bias transconductance device 515 and through the feedback resistor 520 decreases, resulting in a decreased voltage drop across the feedback resistor 520.

The positive side bias circuit 502 also includes a second bias transconductance device 525. A current channel associated with the second bias transconductance device 525 is coupled in series with the feedback resistor 520 and with current channels associated with third and fourth bias transconductance devices 530 and 535, respectively. As the voltage drop across the feedback resistor 520 decreases, the gate-to-source voltage associated with the second bias transconductance device 525 increases and the device 525 becomes increasingly forward biased. Consequently, current flow increases through the second, third, and fourth bias transconductance devices 525, 530, and 535, respectively.

The positive side bias circuit 502 further includes a fifth bias transconductance device 540 coupled to the fourth bias transconductance device 535 to form an output side of a signal recovery current mirror 560. The fifth bias transconductance device 540 injects the recovery current 506 into the input node 504 in order to charge the inter-stage parasitic capacitance 260. Doing so forces any residual signal held by the parasitic capacitance 260 at the input node 504 to a quiescent state when the differential input signal no longer activates a positive side of the dynamic current source 500.

The positive side bias circuit 502 will now be described structurally and functionally as a passive bias source for the output transconductance device 217 when the positive side of the current source 500 is inactive.

The positive side bias circuit 502 includes a first quiescent bias current mirror 542. The first quiescent bias current mirror 542 includes master bias transconductance device 555 and the second bias transconductance device 525. The positive side bias circuit 502 also includes a current source 550. The current source 550 is coupled in series with a current channel associated with the master bias transconductance device 555 to control bias levels at the positive side input node 504.

The positive side bias circuit 502 also includes a second quiescent bias current mirror 556. The second quiescent bias current mirror 556 includes first and third bias transconductance devices 515 and 530, respectively. A current channel associated with the third bias transconductance device 530 is coupled in series with a current channel associated with the second bias transconductance device 525, as previously described. The first bias transconductance device 515 is coupled to the input node 504 to provide bias from a first voltage rail 557 to the input of the positive side output transconductance device 217.

The positive side bias circuit 502 also includes a third quiescent bias current mirror 560. The third quiescent bias current mirror 560 includes fourth and fifth bias transconductance devices 535 and 540, respectively. The current channel associated with the fourth bias transconductance device 535 is configured in series with the current channel associated with the third bias transconductance device 530, as previously described. A current channel associated with the fifth bias transconductance device 540 is coupled to the input node 504 to provide bias from a second voltage rail 562 to the output transconductance device 217.

The current source 500 also includes a negative side bias circuit 503, as previously mentioned. The negative side bias circuit 503 is coupled to an input node 570 associated with the negative side output transconductance device 218. The bias circuit 503 is configured to phase-delay a negative side drive signal appearing at the input node 570. The bias circuit 503 injects a recovery current 572 proportional to the phase-delayed negative side drive signal into the input node 570. The recovery current 572 forces any residual signal held by parasitic capacitance 270 at the input node 570 to a quiescent state when the differential input signal no longer activates a negative side of the dynamic current source 500. Given that the negative side bias circuit 503 is symmetrical to the positive side bias circuit 502, a repeat component level description is omitted herein for brevity.

Figure 6:
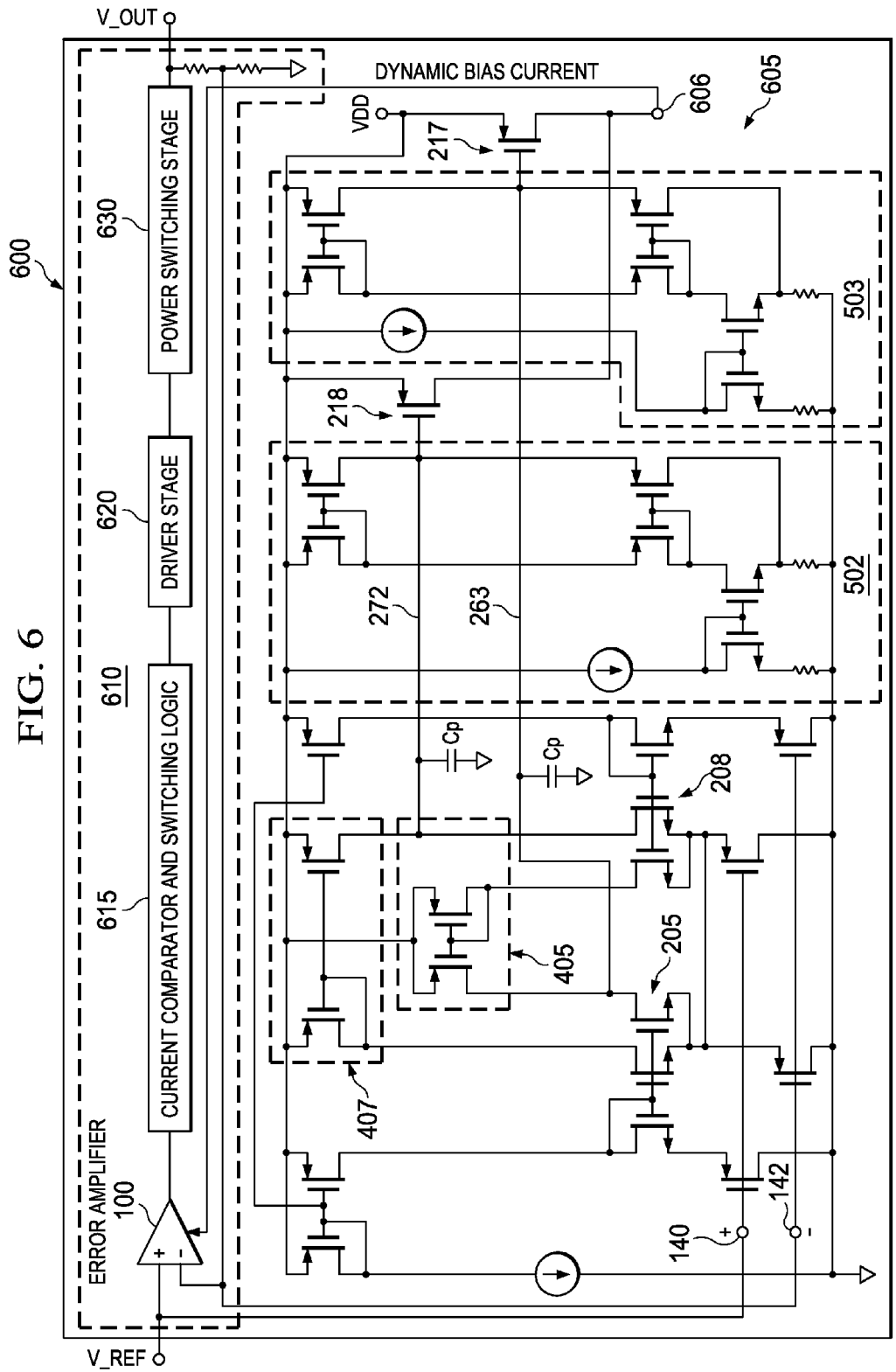
FIG. 6 is a schematic diagram of a power control system 600, including a dynamic current source 605 according to various example embodiments.

FIG. 6 is a schematic diagram of a power control system 600, including a dynamic current source 605 according to various example embodiments. The dynamic current source 605 includes circuits to mitigate frequency dependency associated with inter-stage parasitic capacitance according to various example embodiments. In some example embodiments, the dynamic current source 605 includes positive and negative side input and output stage transconductance devices 205, 208 and 217, 218, respectively. The input pair of transconductance devices 205, 208 and the output pair 217, 218 are each arranged as a long-tailed pair as previously described. The dynamic current source 605 also includes positive and negative side phase dependent current sources 405, 407, 502, and 503. The current sources 405, 407, 502, and 503 provide injection current for inter-stage signal recovery, as previously described.

In some embodiments, the dynamic current source 605 may be configured as a two-stage dynamic bias current source coupled to a linear amplifier 100. In some embodiments, the dynamic current source 605 may be incorporated into the linear amplifier 100. The linear amplifier 100 may be configured to operate as a class AB differential amplifier. The linear amplifier 100 is communicatively coupled to the input pair of transconductance devices 205, 208 at input terminals 140 and 142. The linear amplifier 100 is also communicatively coupled to the output pair of transconductance devices 217, 218 at output terminal 606. The linear amplifier 100 receives dynamic bias current from the current source 605 in an amount proportional to the differential input signal.

In some embodiments, the class AB differential amplifier 100 may be configured as a voltage regulation feedback element in a power supply 610. The power supply 610 may, for example, be configured as a DC-DC converter. The power supply 610 may also include a current comparator and switching logic 615, a driver stage 620, and a power switching stage 630.

Figure 7:
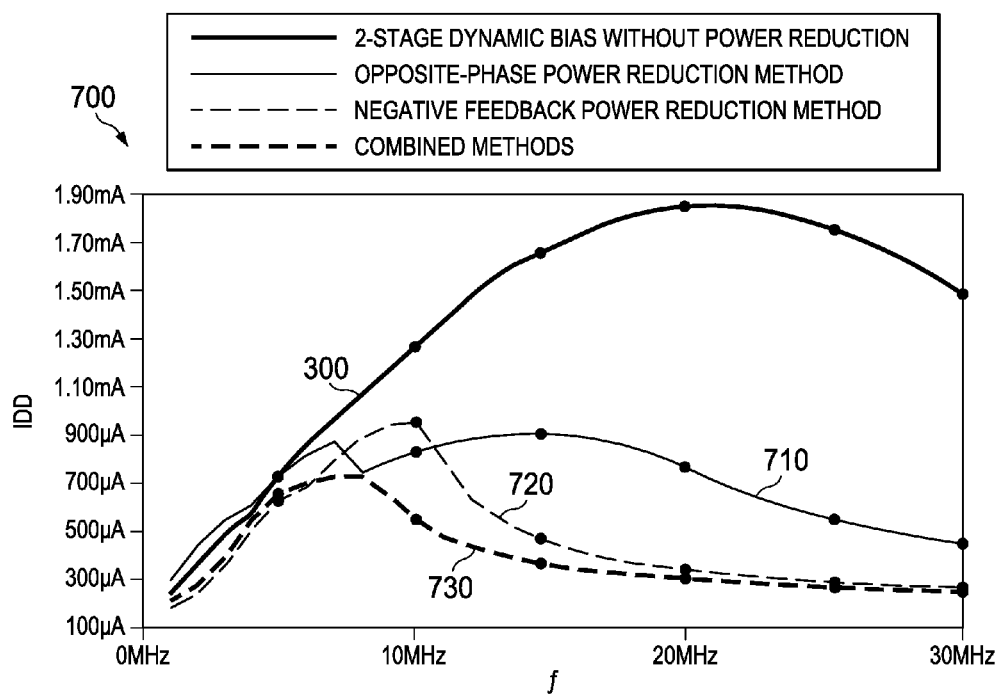
FIG. 7 is a series of plots showing the relative efficacy of various methods of mitigating inter-stage parasitic capacitance in a two-stage dynamic current source according to various example embodiments.

FIG. 7 is a series of plots showing the relative efficacy of various methods of mitigating countering inter-stage parasitic capacitance in a dynamic current source according to various example embodiments. Curve 300 illustrates the frequency dependency of output current without the compensation apparatus described herein. Curve 710 shows a decreased frequency dependency using the phase-delayed first stage bias circuit illustrated in FIG. 4. Curve 720 shows a decreased frequency dependency using the phase-delayed second stage bias circuit illustrated in FIG. 5. Curve 730 shows a decreased frequency dependency using a combination of the first stage and second stage phase-delayed bias circuits as illustrated in FIG. 6.

Apparatus and systems described herein may be useful in applications other than injecting opposite-phase current into an inter-stage node in a dynamic current source to mitigate the effects of inter-stage parasitic capacitance. Examples of the two-stage dynamic current sources of FIGS. 4, 5, and 6 are intended to provide a general understanding of the structures of various embodiments. They are not intended to serve as complete descriptions of all elements and features of apparatus and systems that might make use of these structures.

The various embodiments may be incorporated into electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Apparatus and methods described herein utilize phase-delayed current injection circuits to quickly re-charge inter-stage parasitic capacitance associated with the active side of a class AB dynamic current source shortly after that side becomes inactive. Doing so quickly dissipates an otherwise slowly-decaying residual drive signal and operates to prevent the output stage from continuing to conduct after the associated side of the current source becomes inactive. Excessive current consumption and possible destructive operation of the output stage may be mitigated as a result.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, similarly-arranged structures calculated to achieve substantially the same purpose are contemplated within the scope of the disclosure. Said differently, this disclosure is intended to cover any and all adaptations or variations of various embodiments.

The Abstract of the Disclosure is provided to comply with 37 C.F.R. §1.72(b) requiring an abstract to allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A dynamic current source, comprising:
    positive side and negative side differential input transconductance devices arranged as a long-tailed pair to accept a differential input signal;
    a positive side phase-dependent current source communicatively coupled to an output of the positive side differential input transconductance device to provide current for positive side output signal recovery during a phase period when the differential input signal no longer activates the positive side of the dynamic current source;
    a negative side phase-dependent current source communicatively coupled to an output of the negative side differential input transconductance device to provide current for negative side output signal recovery during a phase period when the differential input signal no longer activates the negative side of the dynamic current source,
    a master current mirror communicatively coupled to the pair of differential input transconductance devices to provide bias current to the pair of differential input transconductance devices; and
    a master current source coupled to the master current mirror to provide root current to the master current mirror.

2. The dynamic current source of claim 1, the positive side phase-dependent current source and the negative side phase-dependent current source each configured as a current mirror.

3. The dynamic current source of claim 2, further comprising:
    an output transconductance device associated with the positive side current mirror channel-coupled to the output of the positive side differential input transconductance device; and
    an output transconductance device associated with the negative side current mirror channel-coupled to the output of the negative side differential input transconductance device.

4. The dynamic current source of claim 2, further comprising:
    a positive side recovery transconductance device communicatively coupled to an input transconductance device associated with the positive side current mirror, an input element of the positive side recovery transconductance device coupled to an input element of the negative side differential input transconductance device; and
    a negative side recovery transconductance device communicatively coupled to an input transconductance device associated with the negative side current mirror, an input element of the negative side recovery transconductance device coupled to an input element of the positive side differential input transconductance device.

5. The dynamic current source of claim 4, further comprising:
    a current channel of the input transconductance device associated with the positive side current mirror coupled in series with a current channel of the positive side recovery transconductance device; and
    a current channel of the input transconductance device associated with the negative side current mirror coupled in series with a current channel of the negative side recovery transconductance device.

6. The dynamic current source of claim 5, at least one of the current channels associated with the differential input transconductance devices, the current channels associated with the current mirror input transconductance devices, or the current channels associated with the recovery transconductance devices configured as metal oxide semiconductor field effect transistor (MOSFET) source-to-drain channels; and at least one of the input elements associated with the differential input transconductance devices or the input elements associated with the recovery transconductance devices configured as MOSFET gates.

7. The dynamic current source of claim 1, further comprising:
    an output pair of transconductance devices arranged as a long-tailed pair to source current proportional to the differential input signal, an input of each one of the output pair of transconductance devices communicatively coupled to an output of a corresponding differential input transconductance device.

8. The dynamic current source of claim 1, further including:
    a pair of differential input transconductance devices arranged as a long-tailed pair to accept the differential input signal.

9. A dynamic current source, comprising:
    a positive side output transconductance device and a negative side output transconductance device, the output transconductance devices arranged as a long-tailed pair to source current in an amount proportional to a differential signal appearing at differential inputs to the dynamic current source;
    a positive side bias circuit coupled to a positive side input node associated with the positive side output transconductance device, the positive side bias circuit configured to phase-delay a positive side drive signal appearing at the positive side input node and to inject a recovery current proportional to the phase-delayed positive side drive signal into the positive side input node in order to force a residual signal held by parasitic capacitance at the positive side input node to a quiescent state when the differential input signal no longer activates a positive side of the dynamic current source; and a negative side bias circuit coupled to an negative side input node associated with the negative side output transconductance device, the negative side bias circuit configured to phase-delay a negative side drive signal appearing at the negative side input node and to inject a recovery current proportional to the phase-delayed negative side drive signal into the negative side input node in order to force a residual signal held by parasitic capacitance at the negative side input node to a quiescent state when the differential input signal no longer activates a negative side of the dynamic current source, at least one of the positive side bias circuit or the negative side bias circuit further comprising:

a first bias transconductance device channel-coupled between the corresponding input node and a negative feedback resistor to ground, current through the first bias transconductance device and through the feedback resistor to decrease as the corresponding output transconductance device is driven to conduct, resulting in a decreased voltage drop across the feedback resistor;

a second bias transconductance device channel-coupled in series with the feedback resistor to ground and with current channels associated with third and fourth bias transconductance devices, the second bias transconductance device to increase channel current through the second, third, and fourth bias transconductance devices in response to an increased control bias voltage at the second bias transconductance device resulting from the decreased voltage drop across the feedback resistor; and a fifth bias transconductance device coupled to the fourth bias transconductance device to form an output side of a signal recovery current mirror and to inject the recovery current into the corresponding input node.

10. The dynamic current source of claim 9, at least one of the positive side bias circuit or the negative side bias circuit further comprising:

a first quiescent bias current mirror comprising a master bias transconductance device and the second bias transconductance device; and a second quiescent bias current mirror comprising the first and third bias transconductance devices, a current channel associated with the third bias transconductance device in series with the second bias transconductance device current channel, the first bias transconductance device coupled to the input of the corresponding output transconductance device to provide bias to the corresponding input node from a first voltage rail.

11. The dynamic current source of claim 10, further comprising:

a current source in series with a current channel associated with the master bias transconductance device to control bias levels at the corresponding input node.

12. The dynamic current source of claim 10, at least one of the positive side bias circuit or the negative side bias circuit further comprising:

a third quiescent bias current mirror comprising the fourth and fifth bias transconductance devices, a current channel associated with the fourth bias transconductance device configured in series with the current channel associated with the third bias transconductance device, and a current channel associated with the fifth bias transconductance device coupled to the corresponding input node to provide input bias voltage to the corresponding output transconductance device from a second voltage rail.

13. The dynamic current source of claim 12, the current channels associated with the third, fourth, and fifth bias transconductance devices configured as metal oxide semiconductor field effect transistor (MOSFET) source-to-drain channels and an input element associated with at least one of the output pair of transconductance devices configured as a MOSFET gate.

14. A power control system, comprising:

positive and negative side differential input transconductance devices associated with a dynamic current source, the differential input transconductance devices arranged as a long-tailed pair to accept a differential input signal;

a positive side phase-dependent current source communicatively coupled to an output of the positive side differential input transconductance device to provide current for positive side output signal recovery during a phase period when the differential input signal no longer activates the positive side of the dynamic current source;

a negative side phase-dependent current source communicatively coupled to an output of the negative side differential input transconductance device to provide current for negative side output signal recovery during a phase period when the differential input signal no longer activates the negative side of the dynamic current source;

a positive side output transconductance device and a negative side output transconductance device, the output transconductance devices arranged as a long-tailed pair to source current from the dynamic current source in an amount proportional to the differential input signal;

a positive side bias circuit coupled to a positive side input node corresponding to the positive side output transconductance device, the positive side bias circuit configured to phase-delay a positive side drive signal appearing at the positive side input node and to inject a recovery current proportional to the phase-delayed positive side drive signal into the positive side input node in order to force a residual signal held by parasitic capacitance at the positive side input node to a quiescent state when the differential input signal no longer activates a positive side of the dynamic current source; and a negative side bias circuit coupled to an negative side input node associated with the negative side output transconductance device, the negative side bias circuit configured to phase-delay a negative side drive signal appearing at the negative side input node and to inject a recovery current proportional to the phase-delayed negative side drive signal into the negative side input node in order to force a residual signal held by parasitic capacitance at the negative side input node to a quiescent state when the differential input signal no longer activates a negative side of the dynamic current source.

15. The power control system of claim 14, configured as a two-stage dynamic bias current source.

16. The power control system of claim 14, further comprising:

a differential amplifier communicatively coupled to the input pair of transconductance devices and to the output pair of transconductance devices to receive a dynamic bias current in an amount proportional to the differential input signal.

17. The power control system of claim 16, the differential amplifier configured as a voltage regulation feedback element in a power supply.

18. The power control system of claim 17, the power supply configured as a DC-DC converter.

\* \* \* \* \*